US008651355B2

(12) United States Patent
Sugito

(10) Patent No.: US 8,651,355 B2
(45) Date of Patent: Feb. 18, 2014

(54) BONDING APPARATUS

(75) Inventor: Akio Sugito, Tokyo (JP)

(73) Assignee: Kaijo Corporation, Tokyo (JP)

( * ) Notice: Subject to any disclaimer, the term of this patent is extended or adjusted under 35 U.S.C. 154(b) by 0 days.

(21) Appl. No.: 13/991,867

(22) PCT Filed: May 28, 2012

(86) PCT No.: PCT/JP2012/063644
§ 371 (c)(1),
(2), (4) Date: Jun. 5, 2013

(87) PCT Pub. No.: WO2013/046802
PCT Pub. Date: Apr. 4, 2013

(65) Prior Publication Data
US 2013/0256385 A1    Oct. 3, 2013

(30) Foreign Application Priority Data
Sep. 28, 2011   (JP) ................. 2011-212037

(51) Int. Cl.
*B23K 37/00*    (2006.01)
(52) U.S. Cl.
USPC .............. 228/4.5; 228/8; 228/103; 228/180.5
(58) Field of Classification Search
None
See application file for complete search history.

(56) References Cited

U.S. PATENT DOCUMENTS

| | | | | |
|---|---|---|---|---|
| 4,789,093 A * | 12/1988 | Bansemir | ................. | 228/1.1 |
| 5,323,952 A * | 6/1994 | Kato et al. | ................. | 228/102 |
| 5,529,236 A * | 6/1996 | Kobayashi | ................. | 228/102 |
| 5,702,049 A * | 12/1997 | Biggs et al. | ................. | 228/105 |
| 5,816,477 A * | 10/1998 | Shimizu | ................. | 228/102 |
| 5,894,981 A * | 4/1999 | Kelly | ................. | 228/104 |
| 5,900,106 A * | 5/1999 | Takahashi et al. | ................. | 156/356 |
| 6,657,799 B2 * | 12/2003 | Hayata | ................. | 359/885 |
| 6,892,927 B2 * | 5/2005 | Rumer et al. | ................. | 228/110.1 |

(Continued)

FOREIGN PATENT DOCUMENTS

| | | |
|---|---|---|
| JP | 01-220451 A | 9/1989 |
| JP | 08-236573 A | 9/1996 |

(Continued)

OTHER PUBLICATIONS

International Search Report (ISR) dated Aug. 28, 2012 (and English translation thereof) issued in parent International Application No. PCT/JP2012/063644.

*Primary Examiner* — Kiley Stoner
(74) *Attorney, Agent, or Firm* — Holtz, Holtz, Goodman & Chick, PC

(57) ABSTRACT

To provide a bonding apparatus capable of bonding at a high speed without performing a height measurement of a bonding point before a searching operation and the bonding. A confocal optical system mounted on a bonding arm pivotable upward and downward and configured to perform detection of a focus of a bonding point located on a surface of a bonded part, a bonding tool configured to be movable integrally with the bonding arm and perform bonding, and position detecting means configured to detect the position of the bonding tool, wherein the bonding tool is configured to move downward by a predetermined distance from a position of the bonding tool detected by the position detecting means by focus detection by the confocal optical system to a preset bonding point (amount of downward movement from a focus) during the downward movement of the bonding tool to the bonding point and stop on the bonding point.

4 Claims, 8 Drawing Sheets

(56) References Cited

U.S. PATENT DOCUMENTS

| | | | |
|---|---|---|---|
| 6,945,446 B2 * | 9/2005 | Hayata | 228/103 |
| 2002/0008131 A1 * | 1/2002 | Hess et al. | 228/105 |
| 2003/0016860 A1 * | 1/2003 | Sugawara | 382/151 |
| 2003/0019911 A1 * | 1/2003 | Beatson et al. | 228/105 |
| 2004/0004106 A1 * | 1/2004 | Franklin et al. | 228/1.1 |
| 2004/0245314 A1 * | 12/2004 | Vischer | 228/4.5 |
| 2011/0114704 A1 * | 5/2011 | Sugawara et al. | 228/102 |
| 2012/0024089 A1 * | 2/2012 | Couey et al. | 73/865.8 |

FOREIGN PATENT DOCUMENTS

| | | | |
|---|---|---|---|
| JP | 2002-076049 A | | 3/2002 |
| JP | 2004-273507 A | | 9/2004 |
| JP | 2006-019475 A | * | 1/2006 |

* cited by examiner

BONDING APPARATUS

TECHNICAL FIELD

The present invention relates to a bonding apparatus configured to connect a first bonding point, for example, an electrode (pad) on a semiconductor chip (IC chip) as a bonded part and a second bonding point, for example, an external lead on a lead frame as a frame with a wire in an assembling process of a semiconductor device and, more specifically, to a bonding apparatus capable of high speed bonding.

BACKGROUND ART

In the related art, as a bonding apparatus configured to connect a pad on an IC chip and an external lead, a wire bonding apparatus as illustrated in FIG. 7 is known.

FIG. 7 is a drawing illustrating a configuration of a wire bonding apparatus of the related art, FIG. 8 is a drawing illustrating a tool height and a search level of the wire bonding apparatus of the related art, FIG. 9(a) illustrates a speed waveform when a bonding tool (capillary) of the wire bonding apparatus of the related art is lowered, and (b) is a drawing illustrating a trajectory of the bonding tool when being lowered.

As illustrated in FIG. 7, a wire bonding apparatus 50 of the related art includes an ultrasonic transducer (not illustrated) and composed of a bonding head 51 including an ultrasonic horn 53 having a capillary 6 as a bonding tool 6 mounted at a distal end thereof, a bonding arm 52 having at one distal end thereof the ultrasonic horn 53 and being coupled at the other end thereof with a supporting shaft 9, an encoder 8 as position detecting means configured to detect the position of the capillary 6 mounted at the distal end of the bonding arm 52, and a linear motor 10 configured to drive the bonding arm 52 upward and downward about the supporting shaft 9, an XY stage 20 as positioning means on which the bonding head 51 is mounted and configured to move the same two dimensionally in an X direction and/or a Y direction and position the same, a bonding stage 22 on which a lead frame having an IC chip 40 or the like mounted thereon is mounted and configured to perform a bonding operation by the capillary 6, a controller unit 55 including a micro processor, and a drive unit 57 configured to emit a drive signal to the bonding head 51 and the XY stage 20 according to a command signal from the controller unit 55.

Also, the wire bonding apparatus 50 also includes a camera (not illustrated) as image pickup means configured to pick up an image of a surface of a bonded part before starting bonding to detect positional displacement of the IC chip 40 and a lead 41 mounted on the bonding head 51.

In the wire bonding apparatus 50, it is necessary to set various conditions, that is, set bonding parameters before performing a series of bonding operations.

The bonding parameters include a tool height, a search level, a search speed, and so forth. Referring now to FIG. 8, these bonding parameters will be described below.

As illustrated in FIG. 8, the tool height (also referred to as "tool height" means a distance from an origin position (O in FIG. 8) of the capillary 6 mounted at the distal end of the ultrasonic horn 53 to a surface of the pad on the IC chip 40 as a first bonding point (La in FIG. 8) and a distance to a surface of the lead 41 as a second bonding point (Lb in FIG. 8). The origin position of the capillary 6 is set in advance. The setting of the tool heights is performed by moving the capillary 6 from an origin position O of the capillary 6 set in advance at a low speed, and obtaining the distance until the distal end of the capillary 6 reaches the bonding surface, that is, the pad of the IC chip 40 or the lead 41 by counting outputs from the encoder 8 as position detecting means configured to detect the position of the capillary 6.

Also, as illustrated in FIGS. 9(a) and (b), a search level S means a height of the capillary 6 when the speed of downward movement of the capillary 6 is changed from a high speed to a low speed. The capillary 6 moves downward at a high speed, reduces the speed at a point before the search level S, and is moved downward at a search speed (Vs in FIG. 9(a)) which is a constant low speed lower than the search level S, and hence a ball engaged at a distal end of the capillary 6 comes into abutment with the pad at the first bonding point. On the other hand, at the second bonding point, the wire lead from the distal end of the capillary 6 comes into abutment with the surface of the lead 41.

As illustrated in FIG. 8, setting of the search levels of the IC chip 40 and the lead 41 on the lead frame L/F is different. In other words, as illustrated in FIG. 8, a height (h1 in FIG. 8) from the surface of the IC chip 40 to a search level (S1 in FIG. 8) is set on the side of the IC chip 40, and a height (h2 in FIG. 8) from the surface of the lead 41 to a search level (S2 in FIG. 8) is set on the lead 41 side. For reference, the search levels on the IC chip 40 side and on the lead 41 side may be the same value.

The reason why the setting of the search level is performed is as follows. In other words, the IC chip 40 mounted on the lead frame L/F or the like is joined with a conductive joint member such as resin, solder, gold, and the like, and hence mounting heights of the IC chips 40 vary from one IC chip 40 to another due to variations in thickness of the joint members. Also, since the joint members tend to have an uneven thickness, the IC chip 40 may be mounted on a tilt in the height direction. On the other hand, as regards the leads as well, the heights of the surfaces of the leads due to variation in thickness of the lead members and warping or the like of the leads.

Therefore, when there are variations in height of the IC chip or the leads, the amount of deformation of the ball may vary because of increase in impact force with respect to the pad upon abutment due to the variation in height or the like, or timing of application of the bonding load and an ultrasonic power may become unequal, whereby the reliability of the bonding may be lowered due to instability of the diameter of ball pressure bonding, joint strength, and the like.

Therefore, the heights of the IC chips and the leads, which are bonded parts, may vary, and hence the heights of the tool vary from one IC chip to another and from one lead to another. Therefore, in order to compensate such variations, the pads and the leads are brought into abutment with each other at a low constant speed. In this manner, the search level S as the bonding parameter needs to be set with due consideration of the variation in height of the IC chips and the variation in height of the lead or the like.

Also, the search speed Vs means a speed of downward movement of the capillary 6 at a level from the search level downward, that is, from a height where the speed of downward movement of the capillary 6 is changed from the high speed to the low speed downward. The search speed Vs is for reducing the amount of initial deformation of the ball due to the impact of the ball upon abutment with respect to the pad.

Subsequently, a bonding process of the wire bonding apparatus of the related art will be described. The wire bonding is performed by moving the capillary 6 downward at a high speed, reducing the speed at a point before the search level S1 illustrated in FIG. 8, moving the same downward from the search level S1 downward at a constant search speed Vs, and presses the ball at the distal end of the capillary 6 against the pad. After the encoder 9 as position detecting means has detected the fact that the ball comes into abutment with the pad, a predetermined bonding load is applied and, simultaneously, an ultrasonic vibration is applied to the distal end of the capillary 6 via the ultrasonic horn 53, whereby the ball is connected to the pad.

Subsequently, the capillary 6 is moved upward according to a predetermined loop control, and is moved in the direction of the lead, which corresponds to the second bonding point. The capillary 6 is lowered at a high speed, is lowered at the search speed Vs from the search level S2 illustrated in FIG. 8, and presses the wire at the distal end of the capillary 6 against the lead.

After the encoder 9 as position detecting means has detected the fact that the wire comes into abutment with the lead, a predetermined bonding load is applied and, simultaneously, an ultrasonic vibration is applied to the distal end of the capillary 6 via the ultrasonic horn 53, whereby the wire is connected to the ball.

Subsequently, the capillary 6 is moved upward to cause the wire to protrude from the distal end of the capillary 6 to a predetermined length, a wire cut clamp (not illustrated) is closed at a preset predetermined rising position of the capillary 6, the wire on the lead is cut, and the wire is extended from the distal end of the capillary 6 by a predetermined length. Subsequently, high voltage is applied between a spark rod (not illustrated) and a wire to form a ball at the distal end of the wire.

As described above, the wire bonding apparatus 50 of the related art sets the search level S in order to compensate the variation in height of the IC chips and the variation in height of the leads, reduces the speed before the search level S, and is further lowered at the sufficiently reduced search speed Vs, then, the fact that the ball or the wire at the distal end of the capillary comes into abutment with the surface of the bonding point is detected by the position detecting means, and then bonding is performed.

However, determination of stop of the bonding arm of the position detecting means is determined later than the actual timing of abutment because determination of abutment with the bonding point is performed when a value of difference between a command speed signal for driving the bonding arm and a feedback speed signal from the encoder reaches or exceeds a preset predetermined value.

In other words, in the wire bonding apparatus 50 of the related art, since the detection is performed after the capillary comes into abutment actually with the pad (or the lead) of the IC chip by the encoder as the position detecting means at the sufficiently reduced search speed Vs, the movement time of the ball or the wire at the distal end of the capillary until coming into abutment with the pad from the search level S is several tens of msec, and there is a problem that the position of abutment is detected several msec behind the actual abutment.

When the distance from the search level to the bonding point is increased or the detection of position by the position detecting means is delayed, time is increased, and the proportion of such temporal delay and the increased time with respect to the entire bonding time is increased, and hence there arises a problem that reduction of the bonding time is difficult.

Therefore, Patent Literature 1 discloses a wire bonding apparatus including a laser displacement gauge configured to detect the height of a position where the wire of the semiconductor chip is bonded in a contactless manner and a control apparatus configured to control the driving of the bonding tool toward the target of driving on the basis of a detection signal from the laser displacement gauge and bond the ball to the electrode of the IC chip, and configured to be capable of bonding without excessively crashing the ball formed on the wire against the work.

Also, Patent Literature 2 discloses a wire bonding apparatus configured to reduce the bonding time by irradiating the semiconductor chip, a substrate, and a lead frame as bonding surfaces with a laser beam, calculating the amount of deviation from a spot position stored in advance, and calculating the height of the actual bonding surface before bonding by obtaining the difference in a height direction from the amount of deviation.

CITATION LIST

Patent Literatures

PTL 1: JP-A-2002-76049
PTL 2: JP-A-2004-273507

SUMMARY OF INVENTION

Technical Problem

However, since measurement of the height of the bonding surface disclosed in Patent Literature 1 is performed by moving the laser displacement gauge right above the bonding point before bonding, movement to the bonding point of the laser displacement gauge and measurement of the height of the same after the movement are required. Such operations increase the bonding time, and hence improvement of number of products of the bonded parts may not be achieved.

Also, in the wire bonding apparatus disclosed in Patent Literature 2, since the semiconductor chip or the like is irradiated with a laser beam before bonding to calculate the actual height of the bonding surface, such operations increase the bonding time, and there is a problem that improvement of number of products of the bonded parts may not be achieved in the same manner as the wire bonding apparatus of Patent Document 1.

Accordingly, it is an object of the present invention to provide a bonding apparatus capable of bonding at a high speed without performing a searching operation or measurement of the height of a bonding point before bonding by mounting a confocal optical system on a bonding arm, and controlling a bonding tool during the downward movement of the bonding tool to the bonding point so as to move downward by a predetermined distance from a position of the bonding tool detected by position detecting means at the time of focus detection by the confocal optical system to a preset bonding point (amount of downward movement from a focus) and stop on the bonding point.

Solution to Problem

In order to achieve the above-described object, a bonding apparatus of the present invention includes: a confocal optical system mounted on a pivotable bonding arm in the upward and downward direction and configured to perform detection of a focus of a bonding point located on a surface of a bonded part, a bonding tool configured to be movable integrally with the bonding arm and perform bonding, and position detecting means configured to detect the position of the bonding tool, wherein the position detecting means is configured to detect the position of the bonding tool on the basis of focus detection by the confocal optical system during the downward movement of the bonding tool to the bonding point.

Also, the bonding apparatus according to the present invention is configured in such a manner that the bonding tool moves downward by a predetermined distance from a position of the bonding tool detected by the position detecting means by focus detection by the confocal optical system to a preset bonding point (amount of downward movement from a focus) and stop on the bonding point.

Also, the bonding tool of the bonding apparatus of the present invention is configured in such a manner that the bonding tool controls to start downward movement on the basis of data of a tool height which corresponds to a distance from an origin position of the preset bonding tool to the bonding point, calculate a new tool height from the data of the position of the bonding tool detected by the position detecting means by the focus detection by the confocal optical system during the downward movement of the bonding tool to the bonding point, change the preset tool height to a new tool height, and stop the bonding tool on the bonding point.

Also, the bonding apparatus according to the present invention is configured in such a manner that when the position of the bonding tool detected by the position detecting means by the focus detection by the confocal optical system while the bonding tool moves downward to the bonding point is out of the preset positional allowable range, the downward movement of the bonding tool is controlled to stop before grounding to the bonding point.

Advantages and Effects of the Invention

According to the present invention, bonding at a high speed without performing a searching operation or measurement of the height of a bonding point before bonding by mounting a confocal optical system on a bonding arm, and controlling a bonding tool during the downward movement of the bonding tool to the bonding point so as to move downward by a predetermined distance from a position of the bonding tool detected by the position detecting means at the time of focus detection by the confocal optical system to a preset bonding point (amount of downward movement from a focus) and stop on the bonding point.

Also, since the present invention detects the focus of the bonding point by the confocal optical system by a series of operations during the downward movement of the bonding tool in the bonding operation, increase in processing time in association with the detection of the focus is avoided, so that improvement in number of product of the bonded parts is achieved.

Also, according to the present invention, since the actual height of the bonding surface needs not to be calculated by irradiating the semiconductor chip or the like with a laser beam before bonding, the improvement in number of products of the bonded parts is achieved.

Also, since the present invention uses the confocal optical system for the detection of the focus at the bonding point, detection of the focus at the bonding point may be detected with high degree of accuracy.

BRIEF DESCRIPTION OF DRAWINGS

FIGS. 5A, 5B and 5C illustrate a state of the confocal optical system at a position of a bonding tool in a bonding operation, in which FIG. 5A illustrates a state of a focal point optical system in which the bonding tool is located at a long distance with respect to a bonding point, FIG. 5B illustrates a position of the bonding tool when the confocal optical system is in a focused state, and FIG. 5C illustrates a state of the focal point optical system at a position where the bonding tool is at a short distance with respect to the bonding point.

DESCRIPTION OF EMBODIMENTS

Figure 1:
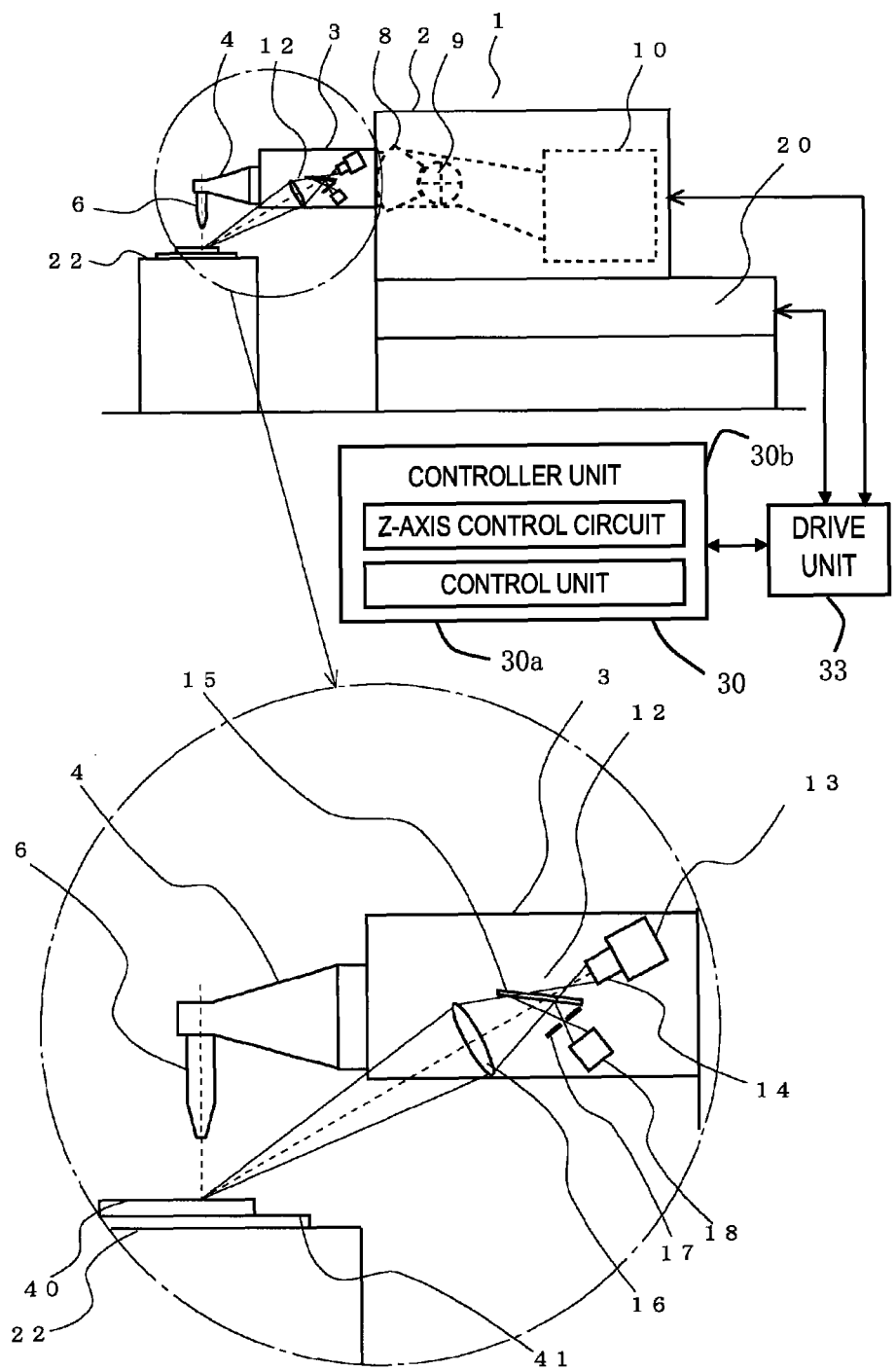
FIG. 1 is a partly enlarged view illustrating a configuration of a bonding apparatus of the present invention.

Referring now to the drawings, embodiments for implementing a bonding apparatus according to the present invention will be described. For reference, as the bonding apparatus, a wire bonding apparatus configured to connect a pad as a first bonding point and a lead as a second bonding point with a metallic wire or the like will be described.

[Configuration of Bonding Apparatus]

Figure 7:
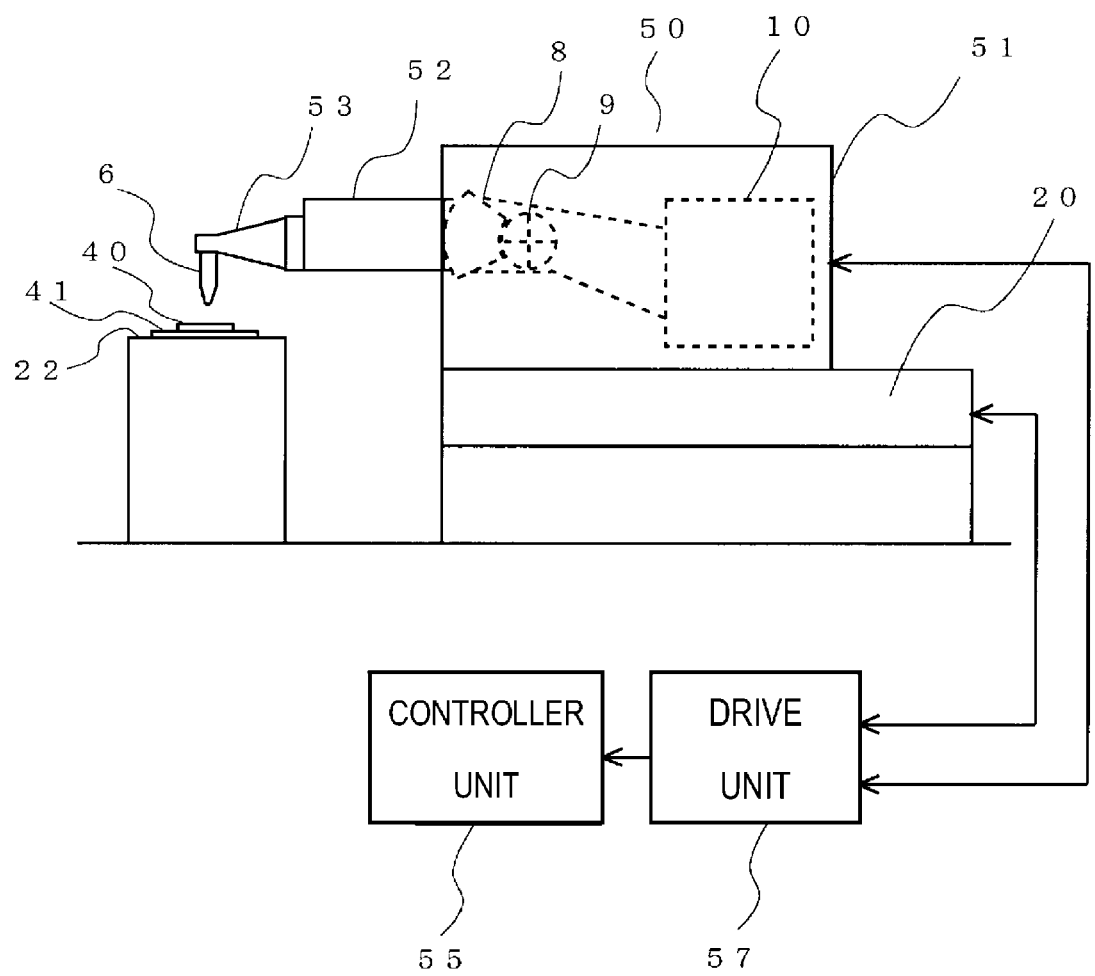
FIG. 7 is a drawing illustrating a configuration of a wire bonding apparatus of the related art.
Figure 8:
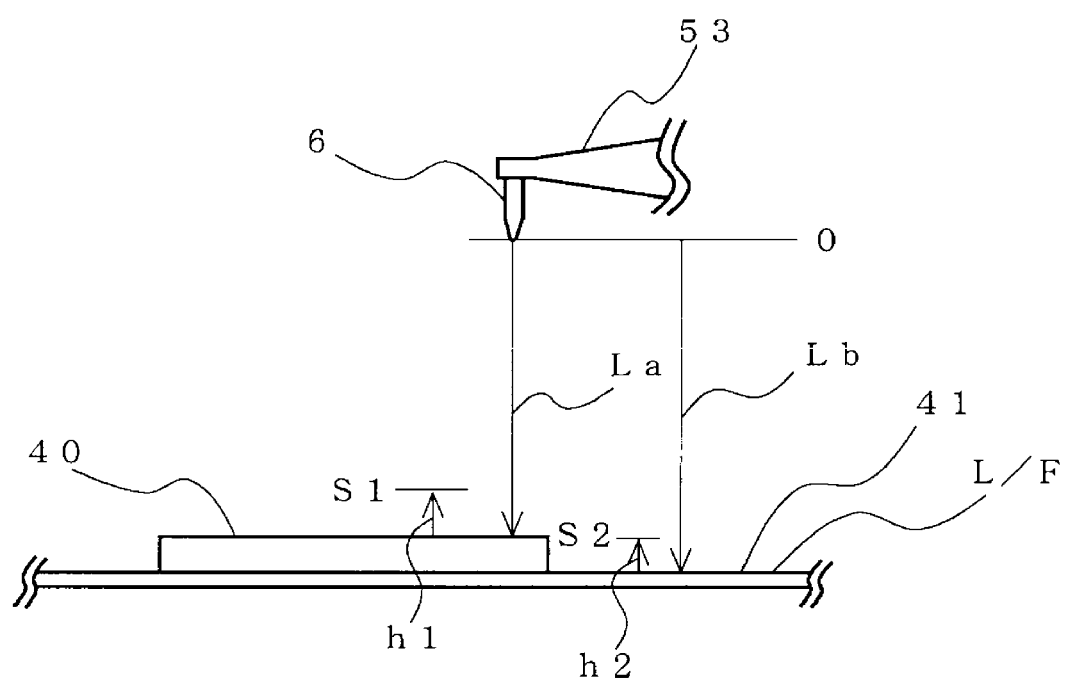
FIG. 8 is a drawing illustrating a tool height and a search level of the wire bonding apparatus of the related art.
Figure 9A:
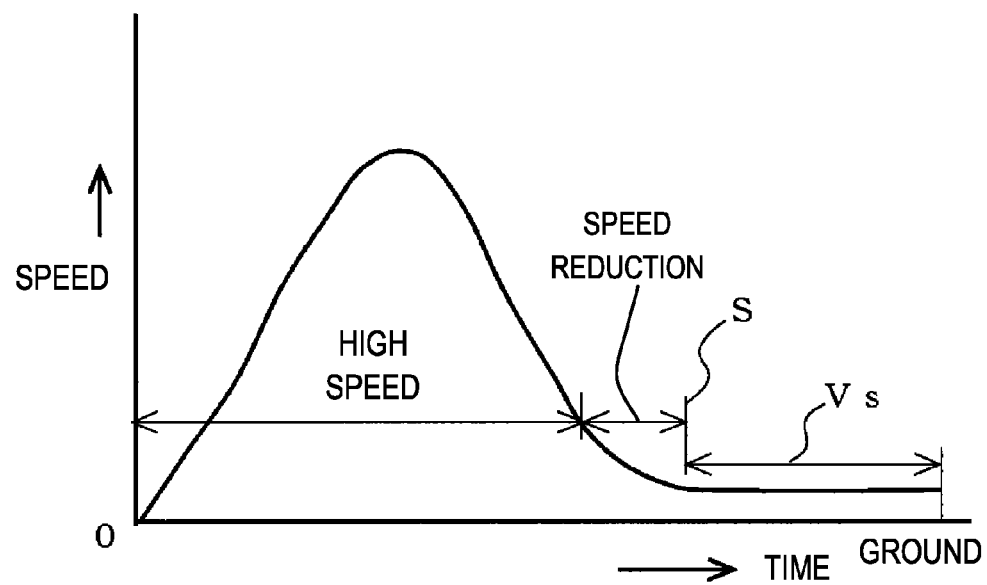
FIG. 9A is a speed waveform when a bonding arm of the wire bonding apparatus of the related art is moving downward.
Figure 9B:
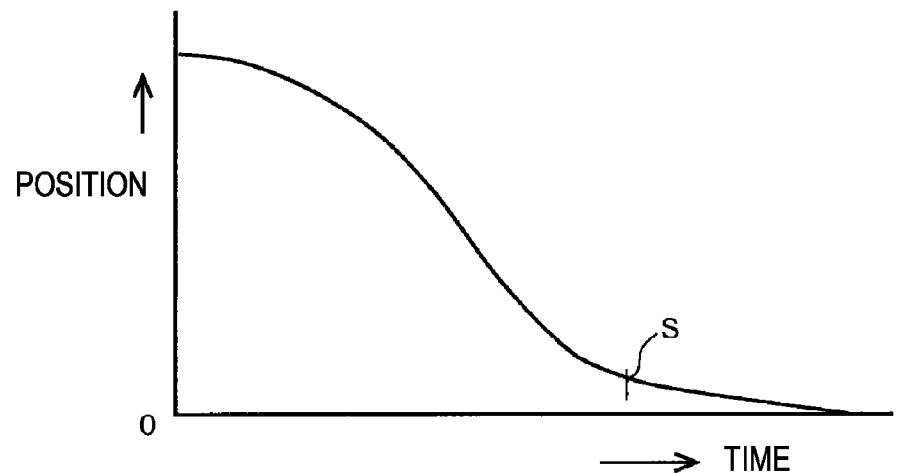
FIG. 9B is a drawing illustrating a trajectory of the bonding arm when moving downward.

FIG. 1 is a drawing including a partly enlarged view illustrating a configuration of a bonding apparatus of the present invention. For reference, the same components as those of the configuration of the wire bonding apparatus of the related art illustrated in FIG. 7 are denoted by the same reference numerals, and detailed descriptions relating to the configurations thereof are omitted.

As illustrated in FIG. 1, a wire bonding apparatus 1 includes a bonding head 2, an XY stage 20 having the bonding head 2 mounted thereon and configured to move in a two-dimensional directions along an XY axis, a bonding stage 22 configured to place a lead frame on which an IC chip 40 as a bonded part is mounted, and a controller unit 30 configured to perform control of the wire bonding apparatus 1.

The bonding head 2 includes a linear motor 10 configured to drive a bonding arm 3 upward and downward via a supporting shaft 9, and an ultrasonic horn 4 in which an ultrasonic transducer (not illustrated) is integrated is mounted at a distal end of the bonding arm 3 positioned on the side opposite to the linear motor 10 with respect to the supporting shaft 9. A capillary 6 as a bonding tool 6 is mounted at a distal end of the ultrasonic horn 4. An ultrasonic horn of a short type is preferably used as the ultrasonic horn 4. For example, as the ultrasonic horn 4, a length from a node position of a vibration transmitting member to a distal end of the vibration transmitting member on the side where the bonding tool is mounted is set to be λ(wavelength)/4. Using the ultrasonic horn of the short type may achieve a configuration in which the angle of an optical axis of a confocal optical system 12 described later with respect to a horizontal axis may be set to be large.

Also, the bonding head 2 includes an encoder 8 as position detecting means configured to detect the position of the capillary 6 mounted at the distal end of the ultrasonic horn 4 by detecting the amount of rotation of the supporting shaft 9. The encoder 8 is, for example, an optical-system rotary encoder, and is configured to convert the rotational displacement of the supporting shaft 9 into a pulsed electric signal by a light-emitting element and a light-receiving element and output the same. The direction of rotation and the amount of displacement of the supporting shaft 9 may be detected by counting an electric signal output from the encoder 8. The position of the capillary 6 may be specified by setting an origin position of the capillary 6 in advance and detecting the amount of rotational displacement of the supporting shaft 9 from the origin position of the capillary 6 by the encoder 8.

The linear motor 10 is configured to move upward and downward (vertically) by a drive unit 33. Accordingly, the bonding arm 3, the ultrasonic horn 4, and the capillary 6 are pivoted in a direction opposite to the upward and downward movement of the linear motor 10 via the supporting shaft 9.

The wire bonding apparatus 1 includes the controller unit 30 including a microcomputer as a control unit 30a and the drive unit 33 configured to emit a drive signal to the bonding head 2 and the XY stage 20 according to a command signal from the controller unit 30.

The microcomputer as the control unit 30a includes a program configured to perform control of a bonding operation or the like of the wire bonding apparatus 1 integrated therein, and the microcomputer is configured to execute a program and perform control of a variety of operations of the wire bonding apparatus 1.

[Configuration and Operation of Confocal Optical System]

Also, the bonding head 2 includes the confocal optical system 12 mounted on the bonding arm 3 and configured to move simultaneously with the upward and downward movement of the bonding arm 3. The confocal optical system 12 includes a semiconductor laser including a light-emitting portion 13, a condensing lens 14 configured to condense light from the semiconductor laser, a half mirror 15 configured to allow the light from the condensing lens 14 to pass therethrough and reflect light from an objective lens 16 and guide to a light-receiving portion 18, the objective lens 16, and a pin hole 17 provided on the side of an incident surface of the light-receiving portion 18. The light from the light-emitting portion 13 is such that the light radiated by the condensing lens 14 is converged to one point (a convergence point of the light-emitting portion 13), then passes through the half mirror 15 and enters the objective lens 16, and then is radiated on the bonding surface by the objective lens 16. The light radiated on the bonding surface reflects and enters the objective lens 16, and a reflected light from the objective lens 16 is reflected by the half mirror 15 and enters the light-receiving portion 18 via the pin hole 17. An optical axis of the confocal optical system 12 is illustrated by a dot line in FIG. 1. For reference, the confocal optical system 12 illustrated in FIG. 1 has a configuration of being integrated into the interior of the bonding arm 3.

Here, the convergence point of the light-emitting portion 13 and the pin hole 17 of the light-receiving portion 18 are set so as to have an optically conjugated positional relationship with respect to the objective lens 16. In other words, the light emitted from the convergence point of the light-emitting portion 13 is condensed to one point of the pin hole 17 of the light-receiving portion 18, and only reflected light from a portion at the focusing position which reflects illuminating light radiated on the bonding surface most strongly enters the light-receiving portion 18 via the pin hole 17 in the confocal optical system 12. The light-receiving portion 18 converts the received reflected light into an electric signal (voltage value) according to the intensity thereof.

Also, in a state in which the capillary 6 as the bonding tool 6 is positioned right above the bonding point, the confocal optical system 12 is set so that the focusing position of the illuminating light from the objective lens 16 comes to the surface of the bonding point of the IC chip 10. In a state in which the focusing position is set in this manner, the capillary 6 is moved downward, and the amount of movement of the capillary 6 when the distal end portion of the capillary 6 comes into contact with the surface of the bonding point is obtained. The amount of movement of the capillary 6 is obtained by setting the position of the capillary 6 at the focusing position as zero, moving the capillary 6 downward, counting the amount of movement by the encoder 8 at this time, and obtaining the amount of movement to the surface of the bonding point.

Accordingly, by sensing a maximum voltage value output from the light-receiving portion 18 of the confocal optical system 12 during the downward movement of the capillary 6, the distance from the position of the capillary 6 at the time of focus detection to the surface of the bonding point is determined, so that the capillary 6 may be controlled to stop the surface of the bonding point.

For reference, the distance from the position of the capillary 6 at the time of focus detection to the surface of the bonding point is determined by a mounting position and a mounting angle of the confocal optical system 12 and the distance of focus from the objective lens 16 of the confocal optical system 12.

Also, the confocal optical system 12 of the wire bonding apparatus 1 of the present invention is integrated into the interior of the bonding arm 3, and an ultrasonic horn of a short type is used so as to be capable of setting the angle of the optical axis of the confocal optical system 12 with respect to the horizontal axis to a large angle. The angle of the optical axis of the confocal optical system 12 with respect to the horizontal axis is preferably 30 degrees or more. In addition, a sliding mechanism as adjusting means configured to slide in parallel to the optical axis for adjusting the distance to the surface of the bonding point of the confocal optical system 12 may be provided.

In this manner, the confocal optical system 12 mounted on the bonding arm 3 moves downward simultaneously with the downward movement of the bonding arm 3, and only reflected light from a portion at the focusing position which reflects illuminating light radiated on the bonding surface most strongly enters the light-receiving portion 18 via the pin hole 17 during the downward movement. The light-receiving portion 18 outputs voltage according to the intensity of incident light. The focus of the confocal optical system 12 may be sensed by checking the voltage value of the light-receiving portion 18.

[Adjustment in Focus Detection]

Figure 2:
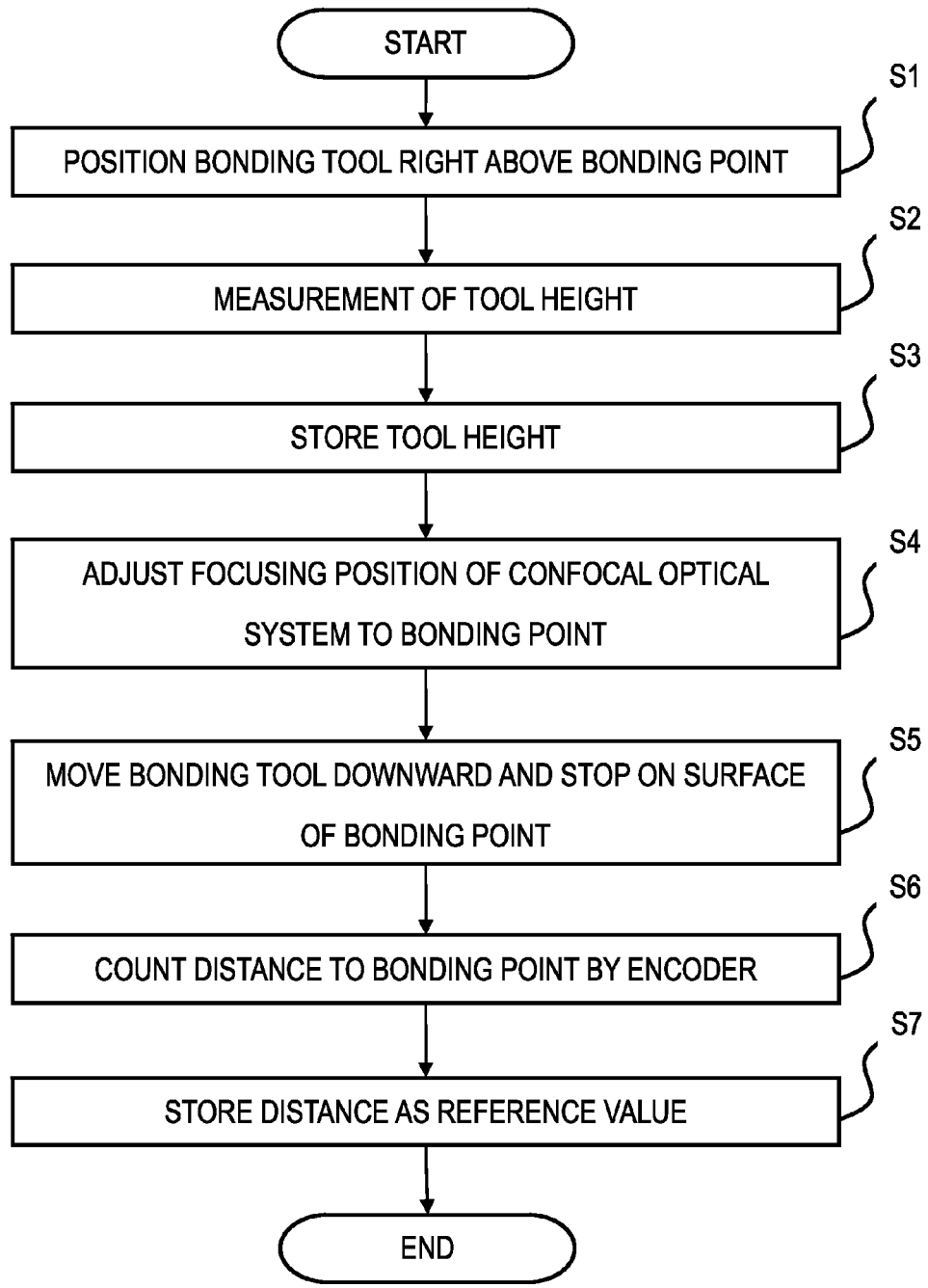
FIG. 2 is a flowchart showing adjustment (self teach) in the focus detection at a bonding point by a confocal optical system.

Referring now to FIG. 2, adjustment (self teach) in the focus detection at the bonding point by the confocal optical system 12 will be described. FIG. 2 is a flowchart showing the adjustment (self teach) in the focus detection at the bonding point by the confocal optical system 12.

In the self teach, firstly, an XY movement switch or the like is operated to move the XY stage 20 to position the capillary 6 right above the bonding point (Step S1). Also, the bonding arm 3 is set to be positioned at an origin. Subsequently, the capillary 6 is moved downward from the origin position and stopped at the bonding surface, and the amount of movement of the capillary 6 at this time is counted by the encoder 8, whereby the tool height is measured (Step S2). The counted amount of movement is stored in a memory as a tool height on the IC chip 40 side (Step S3). Subsequently, the capillary 6 is moved to the origin position.

Subsequently, the capillary 6 is moved downward to adjust the focus of the confocal optical system 12 so as to be positioned on the bonding point (Step S4). The adjustment of the length of the distance from the objective lens 16 of the confocal optical system 12 to the bonding point is performed as needed so that an output voltage from the light-receiving portion 18 of the confocal optical system 12 becomes the maximum.

Subsequently, after the adjustment of the focus on the bonding point has performed, the capillary 6 is moved downward and is stopped on the surface of the bonding point by operating the Z-axis movement switch (Step S5). The distance from the position of the focus at this time to the bonding point is counted by the encoder 8 (Step S6). The distance (amount of movement) counted by the encoder 8 is stored in the memory of the control unit 30*a* as an amount of downward movement from a focus (Step S7). From then onward, the bonding is performed by using the amount of downward movement from the focus at the time of bonding. The tool height on the lead 41 side is also measured.

Figure 3:
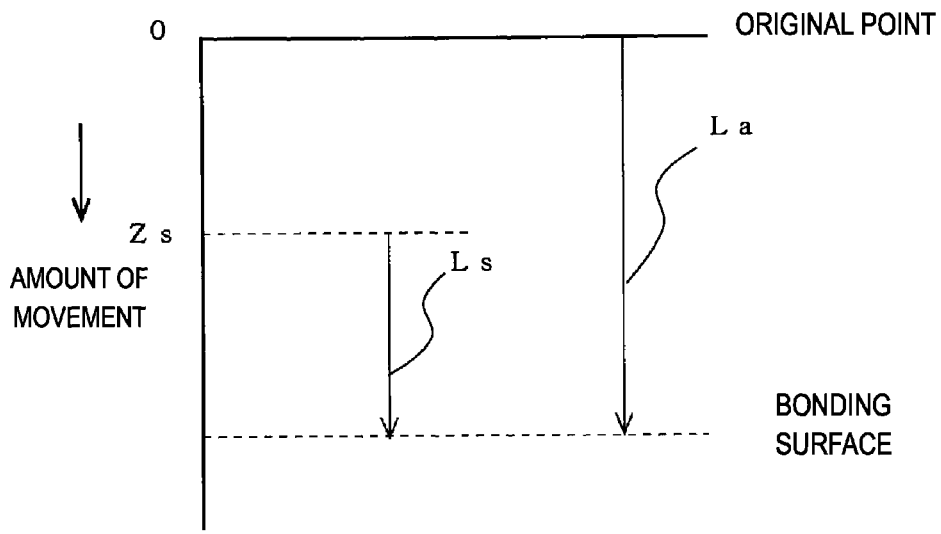
FIG. 3 illustrates a tool height and an amount of downward movement from a focus by the adjustment (self teach).

FIG. 3 illustrates the tool height and the amount of downward movement from the focus on the basis of the self teach. As illustrated in FIG. 3, the tool height from the origin position of the capillary 6 to the bonding surface is denoted by La, and the amount of downward movement from the focus from a position Zs of the capillary 6 at the focus of the confocal optical system 12 to the bonding surface is denoted by Ls. These data is stored in the memory and is used at the time of bonding.

For reference, the self teach is performed in a state in which the ball is formed at the distal end of the capillary 6. Also, when the adjustment is performed in a state in which the ball is not present at the distal end of the capillary 6, the value obtained by subtracting the length of the ball projecting from the distal end of the capillary 6 in the vertical direction from the distance (amount of movement) counted by the encoder 8 is stored as the tool height, and the amount of downward movement from the focus. Also, the self teach of the tool height and the amount of downward movement from the focus is performed at the time of replacement or the like of the capillary 6.

[Determination Reference Value in Focus Detection]

Figure 4:
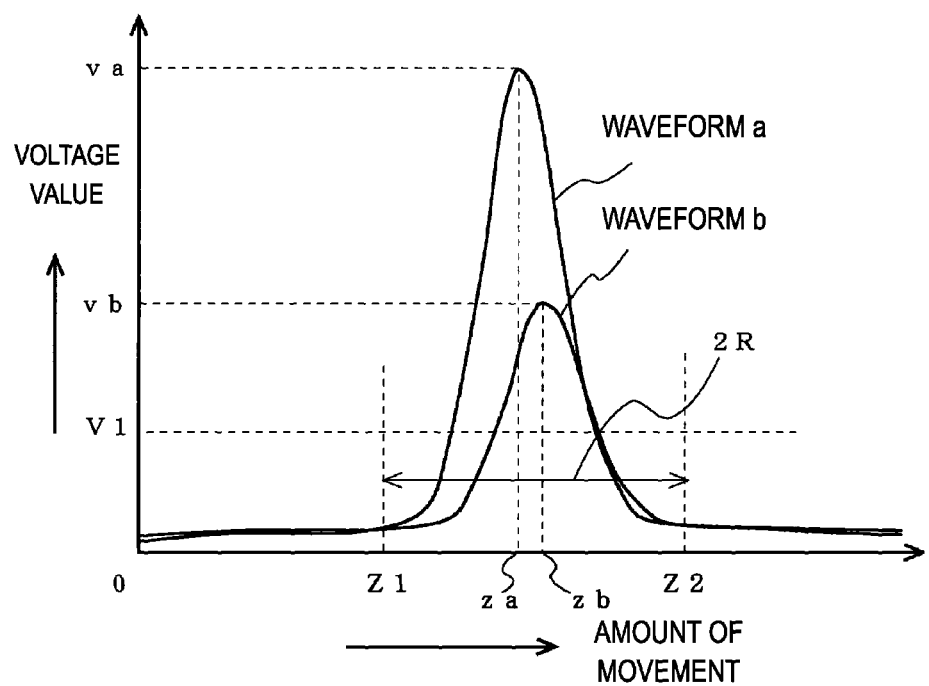
FIG. 4 is a drawing illustrating a voltage value and a determination reference value output from a light-receiving portion of the confocal optical system.

Subsequently, setting of a determination reference value for checking whether or not the focus in the confocal optical system 12 of the bonding surface is normally detected at the time of bonding will be described with reference to FIG. 4. FIG. 4 is a drawing showing a voltage value and the determination reference value output from the light-receiving portion 18 in the confocal optical system 12. For reference, the lateral axis of FIG. 4 represents the amount of movement of the capillary 6 from the origin, and the vertical axis represents the voltage value output from the light-receiving portion 18 of the confocal optical system 12. As illustrated in FIG. 4, a waveform a and a waveform b represent an example of change of the voltage value output from the light-receiving portion 18 when the capillary 6 is moved downward from the origin to the bonding surface. As regards the waveform a, a peak voltage value va is detected at an amount of movement za.

Also, as regards the waveform b, a peak voltage value vb is detected at an amount of movement zb. For reference, although the peak voltage value is different between the waveform a and the waveform b, it is because of the difference in surface state between the bonding surfaces. In the bonding surface in the normal state, the voltage values such as the waveform a and the waveform b are obtained. However, for example, when the bonding surface is chipped, or a lead 41 is subjected to a bending deformation, the peak value of the voltage may be low, or the amount of movement of the capillary 6 at the peak value of the voltage is large or small. In order to detect such abnormal states, the determination reference value is set in advance. The first determination reference value is a voltage reference value for using the voltages equal to or higher than V1 illustrated in FIG. 4 for voltages for detection of the focus. Therefore, among the voltage values output from the light-receiving portion 18, the voltage values no part of which reaches V1 are determined as abnormal and determined as an error because the voltage for detecting the focus cannot be obtained. Also, the second determination reference value is an amount of movement reference value for determining that the amount of movement of the capillary 6 at a peak voltage value falls within a range from Z1 to Z2 illustrated in FIG. 4. The amount of movement reference value as a position allowable range is set so as to be ±R as an allowable range with respect to Zs, where Zs is the amount of movement from the position of origin of the capillary 6 to the focus of the confocal optical system in the self teach illustrated in FIG. 3, for example. Accordingly, Z1 is Zs−R, and Z2 is Zs+R. Therefore, when the amount of movement of the capillary 6 at a position of peak voltage value does not satisfy the amount of movement reference value, it is determined to be abnormal and an error.

[Detection of Focus in Bonding Operation]

Figure 5A:
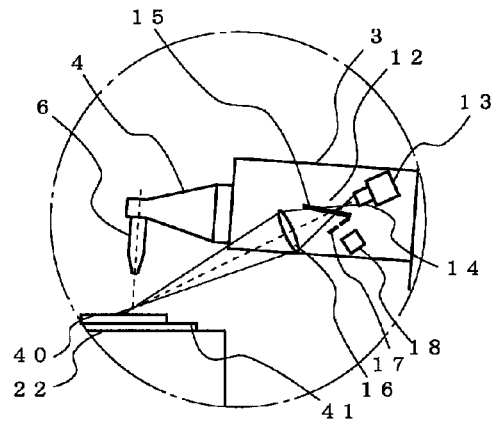
Figure 5B:
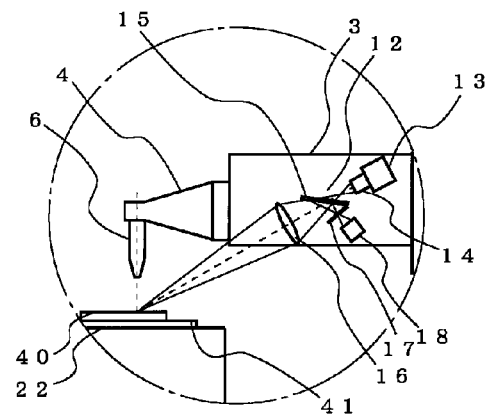
Figure 5C:
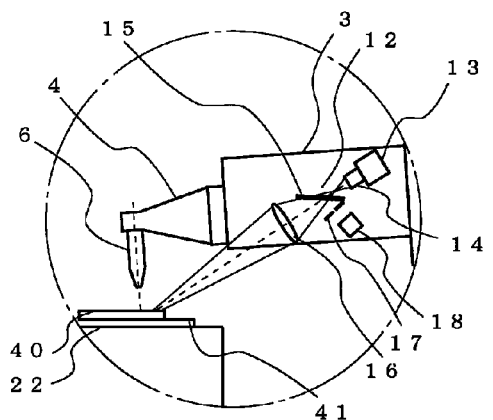

Subsequently, detection of the focus in the confocal optical system in the bonding operation will be described with reference to FIG. 5. FIG. 5 illustrates a state of the confocal optical system at a position of the bonding tool in the bonding operation, in which (a) illustrates a state of a focal point optical system in which the bonding tool is located at a long distance with respect to a bonding point, (b) illustrates a position of the bonding tool when the confocal optical system is in a focused state, and (c) illustrates a state of the focal point optical system at a position where the bonding tool is at a short distance with respect to the bonding point.

As illustrated in FIG. 5(*a*), when the bonding tool is at a long distance with respect to the bonding point, for example, when immediately after the start of downward movement of the capillary 6 as the bonding tool 6, since the distance to the focal point of the illuminating light in the confocal optical system is long, the confocal optical system is brought into a non-focused state, and hence the reflected light does not pass through the pin hole 17, so that the voltage from the light-receiving portion 18 shows a low value. In contrast, as illustrated in FIG. 5(*b*), at a position of the capillary 6 in which the confocal optical system becomes a focused state, the reflected light from the surface of the bonding point passes through the pin hole 17, and the voltage from the light-receiving portion 18 shows a high value. Also, as illustrated in FIG. 5(*c*), when the capillary 6 is at a short distance with respect to the bonding point, for example, when the bonding tool is at a position close to the bonding point, since the distance to the focal point of the illuminating light in the confocal optical system is short and hence a non-focused state results, and hence the reflected light does not pass through the pin hole 17, so that the voltage from the light-receiving portion 18 shows a low value. In this manner, the focused state may be detected by checking the voltage from the light-receiving portion 18 of the wire bonding apparatus 1 while the capillary 6 as the bonding tool 6 moves downward.

[Operation of Z-Axis Control Circuit]

Subsequently, a Z-axis control circuit 30*b* configured to perform control of the capillary 6 via the linear motor 10 will be described. As illustrated in FIG. 1, the Z-axis control circuit 30b is stored in the interior of the controller unit 30, and is configured to perform control of current to be flowed through the linear motor 10 via the drive unit 33 on the basis of a target amount of movement such as a tool height or the like output from the microcomputer of the control unit 30a. In this manner, the Z-axis control circuit 30b is configured to control the movement of the capillary 6 to a target amount of movement at a high speed. The Z-axis control circuit 30b counts pulse rows output from the encoder 8 and controls the count from the encoder 8 to match the target amount of movement, and also detects the speed of the capillary 6 from the pulse rows output from the encoder 8 and controls the high-speed movement. The Z-axis control circuit 30b starts the control of the linear motor 10 with the target amount of movement being set firstly, and is configured to be capable of changing the target amount of movement during the movement control and performing the control on the basis of the changed target amount of movement. The difference between the target amount of movement to be set first and the changed target amount of movement is within several % with respect to the firstly set target amount of movement, and hence the Z-axis control circuit 30b is capable of performing the control stably without being subject to the turbulence of control even when the target amount of movement during the movement control is changed.

[Bonding Operation]

Figure 6:
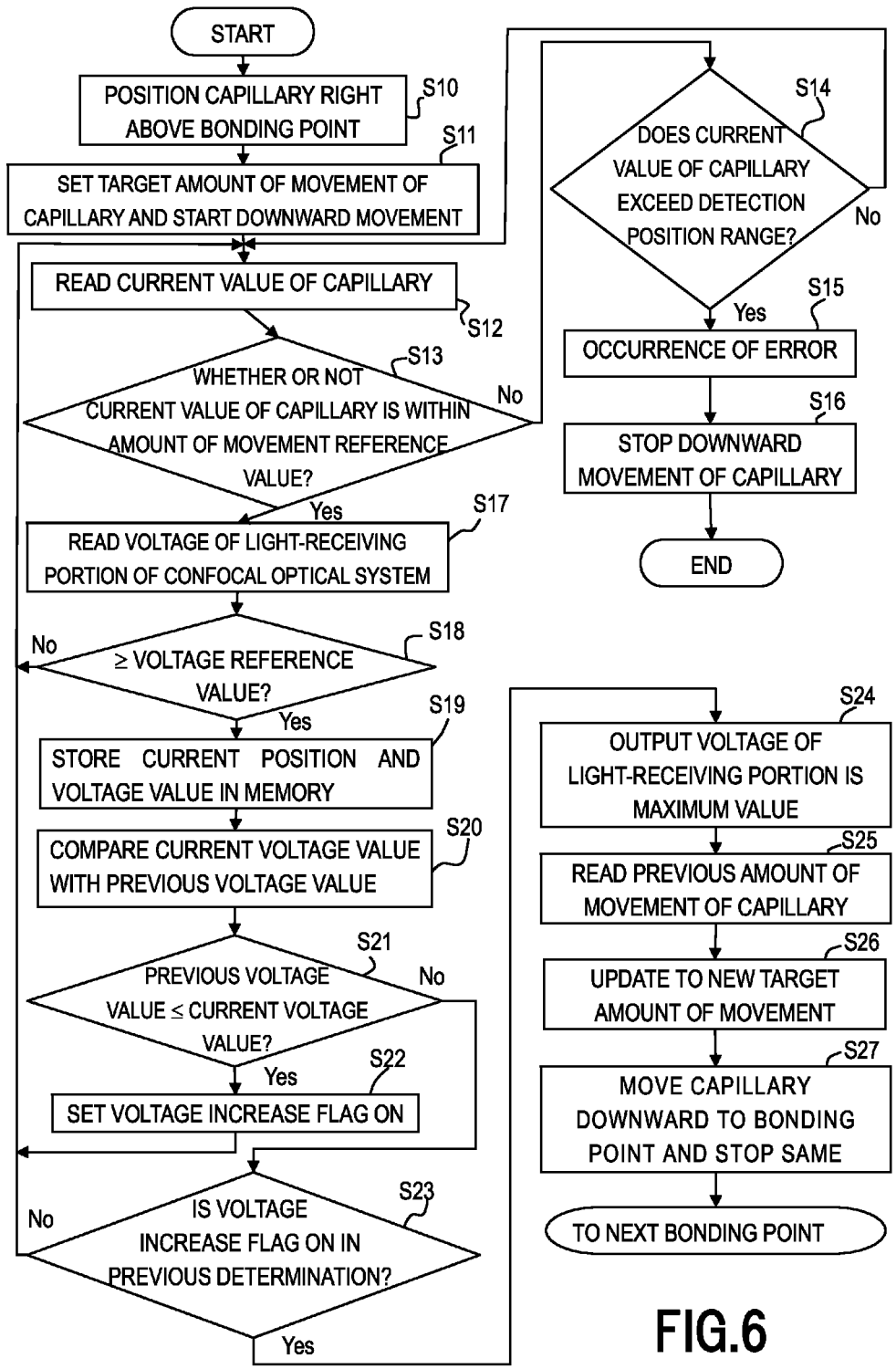
FIG. 6 is a flow chart showing the bonding operation in the focus detection at a bonding point on the surface of a bonded part by the confocal optical system while the bonding tool is moving downward.

Referring now to FIG. 6, the bonding operation of the bonding apparatus in which the confocal optical system is mounted on the bonding arm will be described. FIG. 6 is a flow chart showing the bonding operation using the focus detection at a bonding point on the surface of a bonded part by the confocal optical system while the bonding tool is moving downward.

First of all, the capillary 6 as the bonding tool 6 is positioned right above the bonding point by moving the same to the origin position and also controlling the XY stage 20 (Step S10). The control unit 30a outputs the target amount of movement (the tool height La) to the Z-axis control circuit 30b, and the Z-axis control circuit 30b instructs the start of downward movement so that the capillary 6 moves the target amount of movement (the tool height La) (Step S11). The control unit 30a performs counting of the encoder 8 after the capillary 6 starts the downward movement, and reads a current value of the capillary 6 (Step S12). Whether or not the current value of the read capillary 6 is within the amount of movement reference value, which is the positional allowable range set in advance is checked (Step S13). When the current value of the capillary 6 is out of the amount of movement reference value (No in Step S13), whether or not the current value of the capillary 6 exceeds an upper limit of the amount of movement reference value is checked (Step S14). When the current value of the capillary 6 does not exceed the upper limit of the amount of movement reference value (No, in Step S14), that is, when the current value of the capillary 6 is lower than the lower limit of the amount of movement reference value, the procedure goes to Step S12. In contrast, when the current value of the capillary 6 exceeds the upper limit of the amount movement reference value (Yes in Step S14), it is determined to be an abnormal state, and that the error occurs (Step S15). Then, the downward movement of the capillary 6 is stopped and the error state is notified to the outside (Step S16).

When the current value of the capillary 6 is within the amount of movement reference value (Yes in Step S13), the data of the voltage value of the light-receiving portion 18 in the confocal optical system 12 is read (Step S17). Whether or not the data of the read voltage value of the light-receiving portion 18 is equal to or higher than the voltage reference value set in advance is checked (Step S18). When the data of the read voltage value of the light-receiving portion 18 is lower than the voltage reference (No in Step S18), the procedure goes to Step S12. In contrast, when the data of the read voltage value of the light-receiving portion 18 is equal to or higher than the voltage reference (Yes in Step 18), respective data such as the current value of the capillary 6 and the voltage value of the light-receiving portion 18 are stored in the memory of the control unit 30a (Step S19).

Subsequently, the control unit 30a performs the check of the peak value of the voltage value of the light-receiving portion 18. The voltage value of the light-receiving portion 18 of the previous time is read from the memory and is compared with the current voltage value of the light-receiving portion 18 (Step S20). Whether or not the current voltage value of the light-receiving portion 18 is equal to or higher than the voltage value of the light-receiving portion 18 of the previous time is determined (Step S21) and, when the current voltage value of the light-receiving portion 18 is equal to or higher than the voltage value of the light-receiving portion 18 of the previous time (Yes in Step S21), the voltage value of the light-receiving portion 18 is increased with the downward movement of the capillary 6, and hence a voltage increase flag is set to "ON" and is stored in the memory (Step S22), and the procedure goes to Step S12. In contrast, when the current voltage value of the light-receiving portion 18 is lower than the voltage value of the light-receiving portion 18 of the previous time (No in Step S21), the voltage value of the light-receiving portion 18 is reduced in association with the downward movement of the capillary 6, and the procedure goes to Step S23. In Step S23, the voltage increase flag is read from the memory on the basis of the determination of the voltage value of the previous time and whether or not it is "ON" is checked (Step S23).

When the voltage increase flag is not "ON" (No in Step S23), the procedure goes to Step S12. From this, it is determined that the voltage is reduced temporarily due to the influence of the noise or the like. When the voltage increase flag is "ON" (Yes in Step S23), it is determined that the data of the voltage value of the previous time is a largest value of the output voltage from the light-receiving portion 18 (the peak of the voltage) (Step S24). Also, the amount of movement (amount of downward movement Z1) of the capillary 6 of the previous time which is determined to be the peak of the voltage is read from the memory (Step S25).

The control unit 30a changes the target amount of movement from the tool height La to the Z1+a amount of downward movement from a focus Ls and outputs the same to the Z-axis control circuit 30b as a new target amount of movement (Step S26). Accordingly, the Z-axis control circuit 30b moves downward by the amount of movement of Z1+Ls from the downward movement start position, and stops the capillary 6 right above the bonding point (Step S27).

After the stop of the downward movement of the capillary 6, the predetermined load and an ultrasonic vibration is applied to the capillary 6 for a predetermined period and joint of the bonding surface and the ball at the distal end of the capillary 6 is performed. Subsequently, the capillary 6 is moved upward to be moved to the next bonding point.

Also, as regards the bonding of the lead 41, the bonding operation is performed in the same manner as the pad side. As the tool height of the lead bonding, the preset Lb is used.

In this manner, the bonding apparatus of the present invention is capable of bonding at a high speed without performing a searching operation or measurement of the height by mounting the confocal optical system on the bonding arm, and controlling the bonding tool during the downward movement of the bonding tool to the bonding point so as to move downward by a predetermined distance from a position of the bonding tool at the time of focus detection by the confocal optical system to a preset bonding point (amount of downward movement from a focus) and stop on the bonding point.

For reference, the confocal optical system may be mounted on the bonding arm by, for example, holding the confocal optical system at a tilt by a supporting fixture extending from the bonding arm, instead of integrating the confocal optical system into the interior of the bonding arm as illustrated in FIG. 1, thereby causing the illuminating light to be converted onto the bonding point. Accordingly, the optical axis of the confocal optical system may be configured to be a state closer to the vertical direction.

For reference, although the wire bonding apparatus configured to connect the electrode (pad) on the semiconductor chip (IC chip) and the external lead on the lead frame with a wire as the bonding apparatus has been described, the bonding apparatus of the present invention is not limited to the wire bonding apparatus and may be applied, for example, to a single point bonding apparatus in which wireless bonding is performed or a wire bump bonding apparatus or the like in which the ball formed at the distal end of the wire is joined to the pad on the semiconductor chip to form a bump.

According to the present invention described thus far, bonding at a high speed without performing the searching operation or measurement of the height before bonding by mounting the confocal optical system on the bonding arm, and controlling the bonding tool during the downward movement of the bonding tool to the bonding point so as to move downward by the predetermined distance (amount of downward movement from a focus) from the position of the bonding tool detected by position detecting means at the time of focus detection by the confocal optical system to the preset bonding point and stop on the bonding point.

Also, since the present invention detects the focus of the bonding point by the confocal optical system by a series of operations during the downward movement of the bonding tool in the bonding operation, increase in processing time in association with the detection of the focus is avoided, so that improvement in number of products of the bonded parts is achieved.

Also, in the present invention, since the actual height of the bonding surface needs not to be calculated by irradiating the semiconductor chip or the like with a laser beam before bonding, the improvement in number of products of the bonded parts is achieved.

Also, since the present invention uses the confocal optical system for the detection of the focus at the bonding point, detection of the focus at the bonding point may be detected with high degree of accuracy.

The invention may be embodied in various modes without departing the essential characteristics. Therefore, needless to say, the embodiment described above is given only for description and does not limit the present invention.

REFERENCE SIGNS LIST 1, 50 bonding apparatus (wire bonding apparatus)
2. 51 bonding head
3, 52 bonding arm
4, 53 ultrasonic horn
6 bonding tool (capillary)
8 encoder
9 supporting shaft
10 linear motor
12 confocal optical system
13 light-emitting portion (semiconductor laser)
14 condensing lens
15 half mirror
16 objective lens
17 pin hole
18 light-receiving portion
20 XY-stage
22 bonding stage
30, 55 controller unit
30a control unit (microcomputer)
30b Z-axis control circuit
33, 57 drive unit
40 IC chip
41 lead

The invention claimed is:

1. A bonding apparatus comprising: a confocal optical system mounted on a bonding arm pivotable upward and downward and configured to perform detection of a focus of a bonding point located on a surface of a bonded part; a bonding tool configured to be movable integrally with the bonding arm and perform bonding; and position detecting means configured to detect the position of the bonding tool, wherein
the position detecting means is configured to detect the position of the bonding tool on the basis of focus detection by the confocal optical system while the bonding tool moves downward to the bonding point.

2. The bonding apparatus according to claim 1, wherein the bonding tool is configured to move downward by a predetermined distance from a position of the bonding tool detected by the position detecting means by focus detection by the confocal optical system to a preset bonding point (amount of downward movement from a focus) and stop on the bonding point.

3. The bonding apparatus according to claim 1, wherein the bonding tool controls to start downward movement on the basis of data of a tool height which corresponds to a distance from an origin position of the preset bonding tool to the bonding point, calculate a new tool height from the data of the position of the bonding tool detected by the position detecting means by the focus detection by the confocal optical system during the downward movement of the bonding tool to the bonding point, change the preset tool height to a new tool height, and stop the bonding tool on the bonding point.

4. The bonding apparatus according to claim 1, wherein when the position of the bonding tool detected by the position detecting means by the focus detection by the confocal optical system while the bonding tool moves downward to the bonding point is out of the preset positional allowable range, the downward movement of the bonding tool is controlled to stop before grounding to the bonding point.

* * * * *